US012581759B2

(12) United States Patent
Banachowicz et al.

(10) Patent No.: US 12,581,759 B2
(45) Date of Patent: Mar. 17, 2026

(54) NANOPHOTONIC GLOBAL SHUTTER SENSOR

(71) Applicant: SEMICONDUCTOR COMPONENTS INDUSTRIES, LLC, Scottsdale, AZ (US)

(72) Inventors: Bartosz Piotr Banachowicz, San Jose, CA (US); Swarnal Borthakur, Boise, ID (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 436 days.

(21) Appl. No.: 18/309,906

(22) Filed: May 1, 2023

(65) Prior Publication Data

US 2024/0371898 A1    Nov. 7, 2024

(51) Int. Cl.
*H10F 39/00*      (2025.01)
*H04N 25/532*      (2023.01)

(52) U.S. Cl.
CPC ......... *H10F 39/806* (2025.01); *H04N 25/532* (2023.01); *H10F 39/024* (2025.01); *H10F 39/8057* (2025.01); *H10F 39/807* (2025.01)

(58) Field of Classification Search
CPC .. H10F 39/806; H10F 39/024; H10F 39/8057; H10F 39/807; H10F 39/199; H10F 39/8053; H10F 39/8063; H10F 39/803; H10F 39/8033; H10F 39/8067
See application file for complete search history.

(56) References Cited

U.S. PATENT DOCUMENTS

| 10,432,883 | B1 | 10/2019 | Chapman et al. | |
| 2014/0197301 | A1* | 7/2014 | Velichko | .............. H04N 23/689 |
| | | | | 250/208.1 |
| 2018/0045953 | A1 | 2/2018 | Fan et al. | |

(Continued)

FOREIGN PATENT DOCUMENTS

| KR | 1020220096967 A | 7/2022 |
| WO | 2023013493 A1 | 2/2023 |

OTHER PUBLICATIONS

Yun, Seokho, et al., "Highly Efficient Color Separation and Focusing in the Sub-micron CMOS Image Sensor", International Electron Devices Meeting (IEDM), Dec. 2021, 4 pages.

(Continued)

*Primary Examiner* — Scott B Geyer
(74) *Attorney, Agent, or Firm* — Dickinson Wright PLLC; Jonathan A. Schnayer

(57) ABSTRACT

Image sensor pixels, imaging systems, and methods for constructing image sensor pixels. The image sensor pixel includes a photosensitive region, a charge storage node, a deep trench isolation, and a spectral router. The charge storage node is positioned on a back-side of the photosensitive region. The deep trench isolation extends from a front-side of the photosensitive region toward the charge storage node. The spectral router is positioned on the front-side of the photosensitive region. The spectral router is configured to route photons of a first wavelength received at the spectral router into the photosensitive region and away from the charge storage node. The spectral router is also configured to route photons of a second wavelength received at the spectral router to one or more neighboring image sensor pixels.

13 Claims, 8 Drawing Sheets

(56)                    References Cited

U.S. PATENT DOCUMENTS

| | | | |
|---|---|---|---|
| 2019/0157336 A1 | 5/2019 | Kim et al. | |
| 2019/0196068 A1 | 6/2019 | Tsai et al. | |
| 2021/0118938 A1 | 4/2021 | Roberts et al. | |
| 2022/0415949 A1* | 12/2022 | Tanaka | H04N 23/12 |
| 2023/0417960 A1* | 12/2023 | Zhao | G02B 5/0247 |
| 2024/0395838 A1* | 11/2024 | Sekiguchi | H10F 39/8063 |

OTHER PUBLICATIONS

Kumagai, Y, et al., "Back-Illuminated 2.74 μm-Pixel-Pitch Global Shutter CMOS Image Sensor with Charge-Domain Memory Achieving 10k e-Saturation Signal", International Electron Devices Meeting (IEDM), Dec. 2018, 4 pages.

Zhao, Nathan, et al., "Perfect RGB-IR Color Routers for Sub-Wavelength Size CMOS Image Sensor Pixels", Advanced Photonics Research, Nov. 2020, 16 pages.

Camayd-Munoz, Philip, et.al., "Multifunctional Volumetric Meta-optics for Color and Polarization Image Sensors", Optica, vol. 7, Issue 4, Apr. 2020, pp. 280-283.

Velichko, Sergey, et al., "CMOS Global Shutter Charge Storage Pixels with Improved Performance", Electron Devices, vol. 63, No. 1, Jan. 2016, 7 pages.

* cited by examiner

700

702 — FORM PHOTOSENSITIVE REGION

704 — FORM CHARGE STORAGE NODE POSITIONED AT BACK-SIDE OF PHOTOSENSITIVE REGION

706 — FORM PARTIAL DEEP TRENCH ISOLATION EXTENDING FROM FRONT-SIDE OF PHOTO-SENSITIVE REGION TOWARD CHARGE STORAGE NODE

708 — FORM SPECTRAL ROUTER POSITIONED ON FRONT-SIDE OF PHOTOSENSITIVE REGION

1

NANOPHOTONIC GLOBAL SHUTTER SENSOR

BACKGROUND

Image sensors are used in electronic devices such as cellular telephones, cameras, and computers to capture images. In particular, an electronic device is provided with an array of image sensor pixels arranged in a grid pattern. Each image sensor pixel receives incident photons, such as light, and converts the photons into electrical signals. Column circuitry is coupled to each column for reading out sensor signals from each image sensor pixel.

SUMMARY

Global shutter imaging systems perform global exposure of all pixels at the same time. However, the readout of the pixels is sequential. Thus, a charge storage node in a pixel may collect unwanted charge before the row of that pixel is read. In an array of pixels, the pixels in the rows that are read last may be most negatively impacted from unwanted charge, such as parasitic light. In front-side illumination sensors, the charge storage nodes are positioned on the front-side of the photodiode substrates and the light enters from the front-side. There are various solutions available for front-side illumination sensors to isolate charge storage nodes from the photodiode substrates. In back-side illumination sensors, the charge storage nodes are also positioned on the front-side of the photodiode substrates but the light enter from the back-side. It is difficult to protect charge storage nodes from incoming, reflected, and scattered light from the back-side of photodiode substrates. Thus, the present disclosure provides image sensor pixels, imaging systems, and methods that, among other things, use nanophotonic light guides (or spectral routers) to divert unwanted light away from charge storage nodes in back-side illumination pixels.

The present disclosure provides an image sensor pixel including, in one implementation, a photosensitive region, a charge storage node, a deep trench isolation, and a spectral router. The charge storage node is positioned on a back-side of the photosensitive region. The deep trench isolation extends from a front-side of the photosensitive region toward the charge storage node. The spectral router is positioned on the front-side of the photosensitive region. The spectral router is configured to route photons of a first wavelength received at the spectral router into the photosensitive region and away from the charge storage node. The spectral router is also configured to route photons of a second wavelength received at the spectral router to one or more neighboring image sensor pixels.

The present disclosure also provides an image sensor pixel including, in one implementation, a photosensitive region, a charge storage node, a deep trench isolation, a first spectral router, and a second spectral router. The charge storage node is positioned on a back-side of the photosensitive region. The deep trench isolation extends from a front-side of the photosensitive region toward the charge storage node. The first spectral router is positioned on the front-side of the photosensitive region. The first spectral router is configured to route photons of a first wavelength received at the first spectral router into the photosensitive region. The second spectral router is positioned on a front-side of the first spectral router. The second spectral router is configured to route photons of the first wavelength received at the second spectral router to the first spectral router.

The present disclosure further provides a method for constructing an image sensor pixel. The method includes forming a photosensitive region. The method also includes forming a charge storage node positioned at a back-side of the photosensitive region. The method further includes forming a partial deep trench isolation extending from a front-side of the photosensitive region toward the charge storage node. The method also includes forming a spectral router positioned on the front-side of the photosensitive region. The spectral router is configured to route photons of a first wavelength received at the spectral router into the photosensitive region and away from the charge storage node. The spectral router is also configured to route photons of a second wavelength received at the spectral router to one or more neighboring image sensor pixels.

BRIEF DESCRIPTION OF THE DRAWINGS

For a detailed description of example implementations, reference will now be made to the accompanying drawings in which.

DEFINITIONS

Figure 1A:
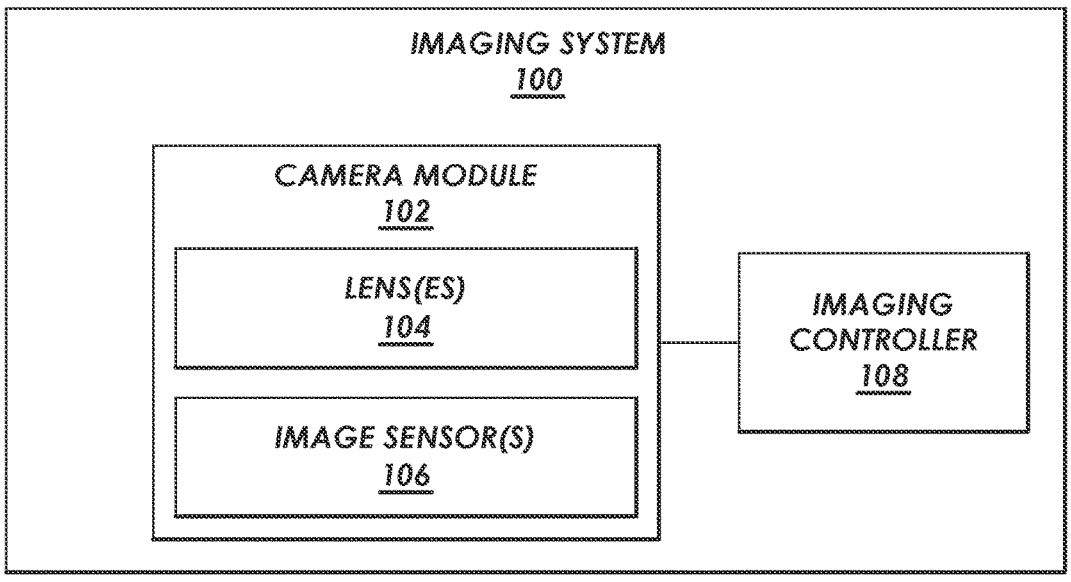
FIG. 1A is a block diagram of an example of an imaging system in accordance with some implementations.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

Terms defining an elevation, such as "above," "below," "upper", and "lower" shall be locational terms in reference to a direction of light incident upon a pixel array and/or an image pixel. Light entering shall be considered to interact with or pass objects and/or structures that are "above" and "upper" before interacting with or passing objects and/or structures that are "below" or "lower." Thus, the locational terms may not have any relationship to the direction of the force of gravity.

In relation to electrical devices, whether stand alone or as part of an integrated circuit, the terms "input" and "output" refer to electrical connections to the electrical devices, and shall not be read as verbs requiring action. For example, a differential amplifier, such as an operational amplifier, may have a first differential input and a second differential input, and these "inputs" define electrical connections to the operational amplifier, and shall not be read to require inputting signals to the operational amplifier.

"Assert" shall mean changing the state of a Boolean signal. Boolean signals may be asserted high or with a higher voltage, and Boolean signals may be asserted low or with a lower voltage, at the discretion of the circuit designer. Similarly, "de-assert" shall mean changing the state of the Boolean signal to a voltage level opposite the asserted state.

"Light" or "color" shall mean visible light ranging between about 380 and 700 nanometers (nm). "Light" or "color" shall also mean invisible light, such as infrared light ranging between about 800 nm and 1 millimeter. "Light" or "color" shall also mean invisible light, such as ultraviolet light ranging between about 100 to 400 nm.

"Controller" shall mean, alone or in combination, individual circuit components, an application specific integrated circuit (ASIC), a microcontroller with controlling software, a reduced-instruction-set computer (RISC) with controlling software, a digital signal processor (DSP), a processor with controlling software, a programmable logic device (PLD), a field programmable gate array (FPGA), or a programmable system-on-a-chip (PSOC), configured to read inputs and drive outputs responsive to the inputs.

DETAILED DESCRIPTION

The following discussion is directed to various implementations of the invention. Although one or more of these implementations may be preferred, the implementations disclosed should not be interpreted, or otherwise used, as limiting the scope of the present disclosure, including the claims. In addition, one skilled in the art will understand that the following description has broad application, and the discussion of any implementation is meant only to be exemplary of that implementation, and not intended to intimate that the scope of the present disclosure, including the claims, is limited to that implementation.

Various examples are directed to imaging systems, image sensor pixels, and related methods. More particularly, at least some examples are directed to global shutter imaging systems with back-side illumination sensor pixels. More particularly, various examples are directed to back-side illumination (BSI) pixels that use nanophotonic light guides to direct incoming light away from charge storage nodes. The specification now turns to an example system to orient the reader.

FIG. 1A shows an example of an imaging system 100. In particular, the imaging system 100 may be a portable electronic device such as a camera, a cellular telephone, a tablet computer, a webcam, a video camera, a video surveillance system, or a video gaming system with imaging capabilities. In other cases, the imaging system 100 may be an automotive imaging system. The imaging system 100 illustrated in FIG. 1A includes a camera module 102 that may be used to convert incoming light into digital image data. The camera module 102 may include one or more lenses 104 and one or more corresponding image sensors 106. The lenses 104 may include fixed and/or adjustable lenses. During image capture operations, light from a scene may be focused onto the image sensor 106 by the lenses 104. The image sensor 106 may comprise circuitry for converting analog pixel data into corresponding digital image data to be provided to the imaging controller 108. If desired, the camera module 102 may be provided with an array of lenses 104 and an array of corresponding image sensors 106.

The imaging controller 108 may include one or more integrated circuits. The imaging circuits may include image processing circuits, microprocessors, and storage devices, such as random-access memory, and non-volatile memory. The imaging controller 108 may be implemented using components that are separate from the camera module 102 and/or that form part of the camera module 102, for example, circuits that form part of the image sensor 106. Digital image data captured by the camera module 102 may be processed and stored using the imaging controller 108. Processed image data may, if desired, be provided to external equipment, such as computer, external display, or other device, using wired and/or wireless communications paths coupled to the imaging controller 108.

Figure 1B:
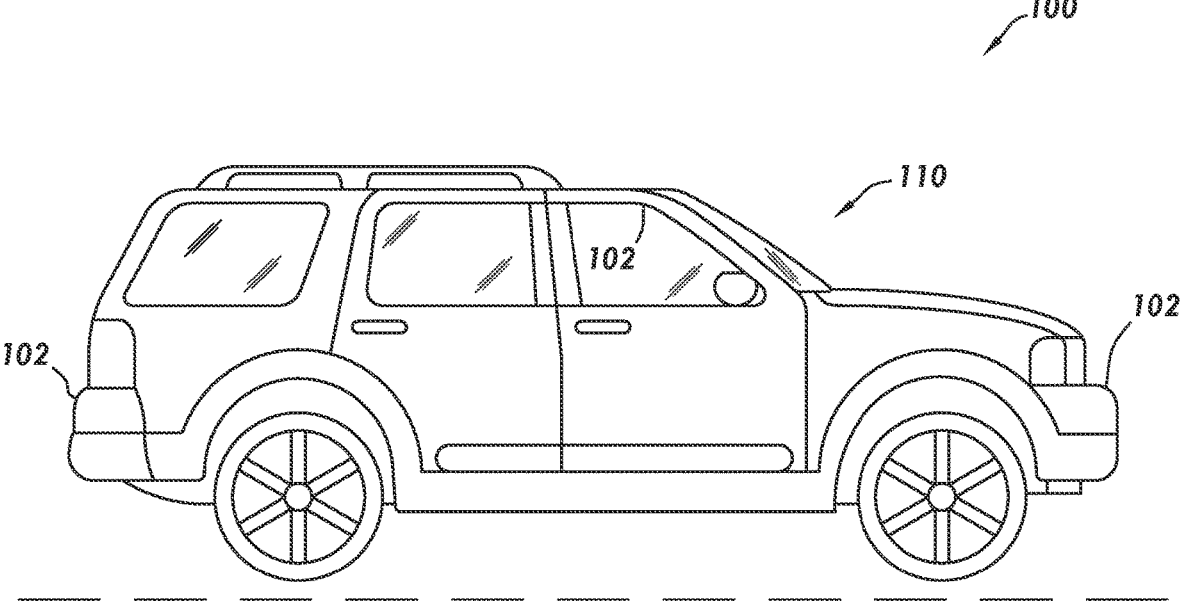
FIG. 1B is a diagram of an example of an imaging system incorporated in a vehicle in accordance with some implementations.

FIG. 1B shows another example of the imaging system 100. The imaging system 100 illustrated in FIG. 1B comprises an automobile or vehicle 110. The vehicle 110 is illustratively shown as a passenger vehicle, but the imaging system 100 may be other types of vehicles, including commercial vehicles, on-road vehicles, and off-road vehicles. Commercial vehicles may include busses and tractor-trailer vehicles. Off-road vehicles may include tractors and crop harvesting equipment. In the example of FIG. 1B, the vehicle 110 includes a forward-looking cameral module 102 arranged to capture images of scenes in front of the vehicle 110. Such forward-looking camera module 102 can be used for any suitable purpose, such as lane-keeping assist, collision warning systems, distance-pacing cruise-control systems, autonomous driving systems, and proximity detection. The vehicle 110 further comprises a backward-looking camera module 102 arranged to capture images of scenes behind the vehicle 110. Such backward-looking camera module 102 can be used for any suitable purpose, such as collision warning systems, reverse direction video, autonomous driving systems, proximity detection, monitoring position of overtaking vehicles, and backing up. The vehicle 110 further comprises a side-looking camera module 102 arranged to capture images of scenes beside the vehicle 110. Such side-looking camera module can be used for any suitable purpose, such as blind-spot monitoring, collision warning systems, autonomous driving systems, monitoring position of overtaking vehicles, lane-change detection, and proximity detection. In situation in which the imaging system 100 is a vehicle, the imaging controller 108 may be a controller of the vehicle 110. The discussion now turns in greater detail to the image sensor 106 of the camera module 102.

Figure 2A:
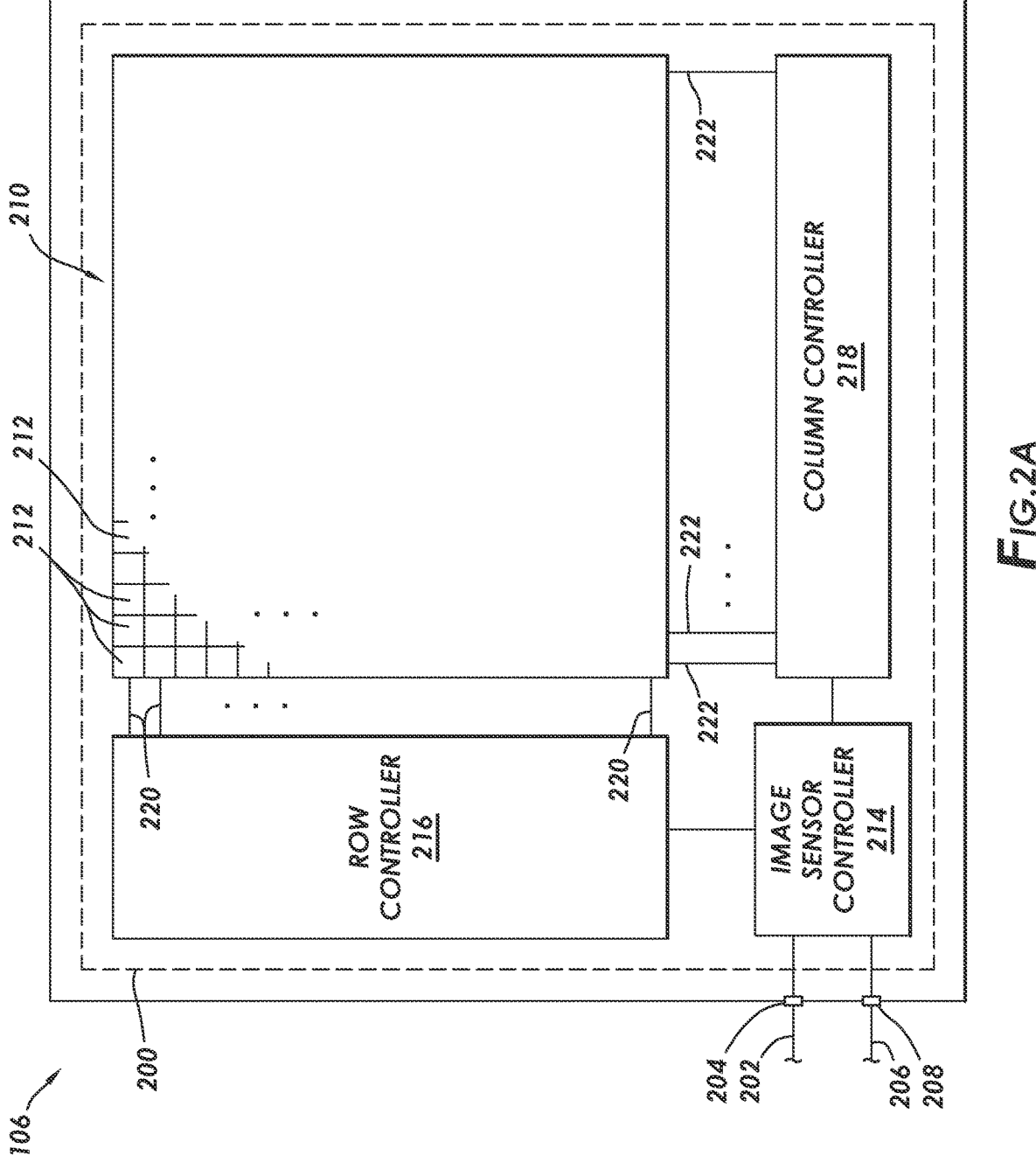
FIG. 2A is a partial schematic and a partial block diagram of an example of an image sensor in accordance with some implementations.

FIG. 2A shows an example of the image sensor 106. In particular, FIG. 2A shows that the image sensor 106 may comprise a substrate 200 of semiconductor material (for example, silicon) encapsulated within packaging to create a packaged semiconductor device or packaged semiconductor product. Bond pads or other connection points of the substrate 200 couple to terminals of the image sensor 106, such as the serial communication channel 202 coupled to terminal(s) 204, and capture input 206 coupled to terminal 208. Additional terminals will be present, such as ground, common, or power, but the additional terminals are omitted so as not to unduly complicate the figure. While a single instance of the substrate 200 is shown, in other cases multiple substrates may be combined to form the image sensor 106 to form a multi-chip module.

The image sensor 106 comprises a pixel array 210 containing a plurality of image sensor pixels 212 arranged in rows and columns. Pixel array 210, being one example of an "array of pixels," may comprise, for example, hundreds or thousands of rows and columns of image sensor pixels 212. Control and readout of the pixel array 210 may be implemented by an image sensor controller 214 coupled to a row controller 216 and a column controller 218. The row controller 216 may receive row addresses from image sensor controller 214 and supply corresponding row control signals to image sensor pixels 212, such as reset, row-select, charge transfer, dual conversion gain, and readout control signals. The row control signals may be communicated over one or more conductors, such as row control paths 220.

Column controller 218 may be coupled to the pixel array 210 by way of one or more conductors, such as column lines 222. Column controllers may sometimes be referred to as column control circuits, readout circuit, or column decoders. Column lines 222 may be used for reading out image signals from image sensor pixels 212 and for supplying bias currents and/or bias voltages to image sensor pixels 212. If desired, during pixel readout operations, a pixel row in the pixel array 210 may be selected using row controller 216 and image signals generated by image sensor pixels 212 in that pixel row can be read out along column lines 222. The column controller 218 may include sample-and-hold circuitry for sampling and temporarily storing image signals read out from pixel array 210, amplifier circuitry, analog-to-digital conversion (ADC) circuitry, bias circuitry, column memory, latch circuitry for selectively enabling or disabling the column circuitry, or other circuitry that is coupled to one or more columns of pixels in the pixel array 210 for operating the image sensor pixels 212 and for reading out image signals from the image sensor pixels 212. ADC circuitry in the column controller 218 may convert analog pixel values received from the pixel array 210 into corresponding digital image data. Column controller 218 may supply digital image data to the image sensor controller 214 and/or the imaging controller 108 (FIG. 1A) over, for example, the serial communication channel 202.

Figure 2B:
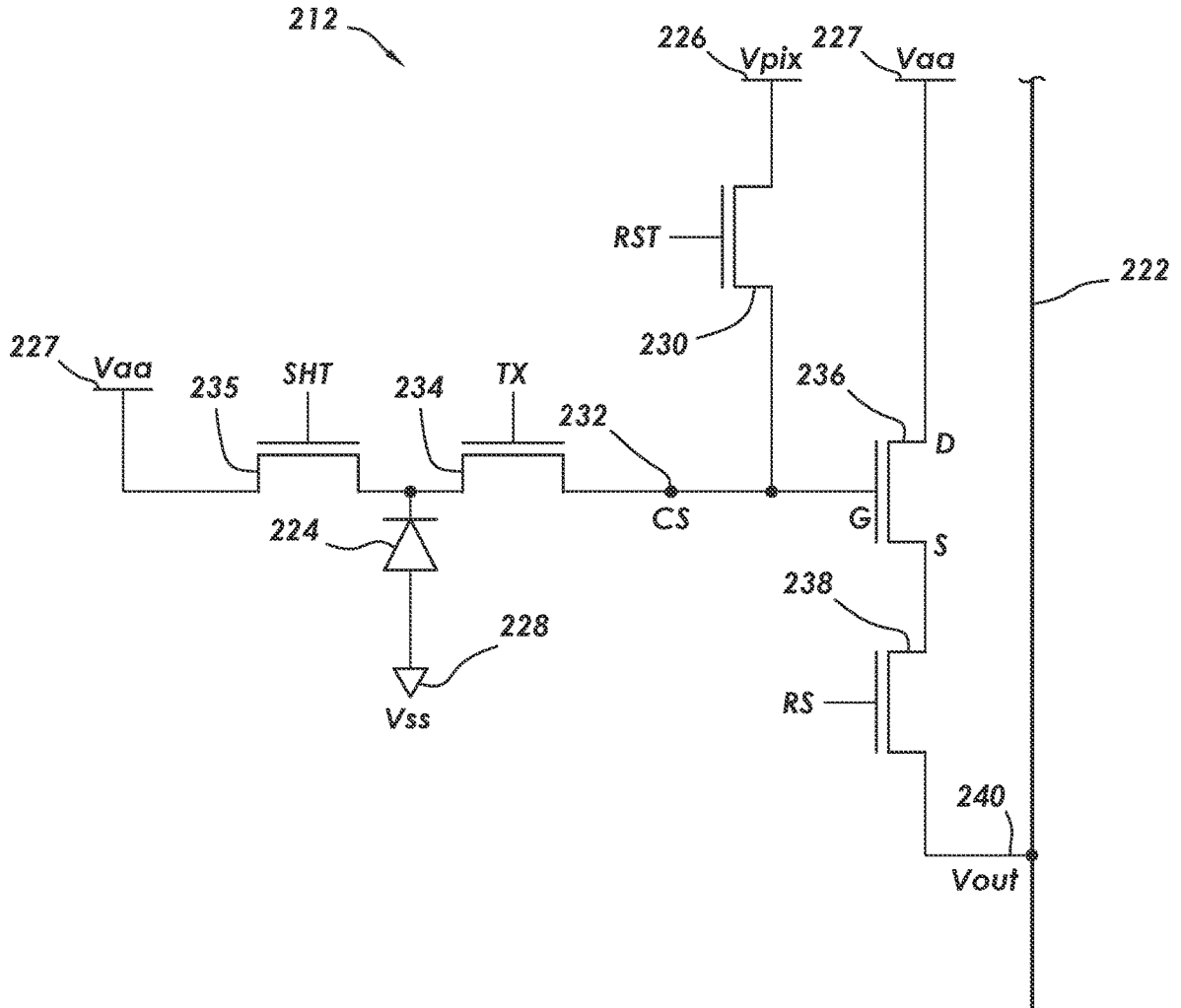
FIG. 2B is a schematic of an example of circuitry in an image sensor pixel in accordance with some implementations.

FIG. 2B shows an example of circuitry in the image sensor pixel 212. The image sensor pixel 212 may have fewer, additional, or different components in different configurations than the one illustrated in FIG. 2B. In particular, FIG. 2B shows that the image sensor pixel 212 may comprise a photodetector 224 (for example, a pinned photodiode). Positive power supply voltages (Vpix and Vaa) may be supplied at positive power supply terminals 226 and 227, respectively. A ground power supply voltage may be supplied at a ground terminal 228. Incoming light is gathered by the photodetector 224 and converted to electrical charge.

Before an image is acquired, a reset control signal RST may be asserted. The reset control signal RST makes conductive or turns on a reset transistor 230 and resets a charge storage (CS) node 232 to a voltage equal or close to the voltage Vpix. The reset control signal RST may be de-asserted to make non-conductive or turn off the reset transistor 230. After the reset process is complete, a transfer gate control signal TX may be asserted to turn on a transfer transistor 234. When the gate of the transfer transistor 234 is turned on, the charge that has been generated by the photodetector 224 in response to incoming light is transferred to the charge storage node 232. The charge storage node 232 exhibits a capacitance that can be used to store the charge that has been transferred from the photodetector 224 after the transfer gate control signal TX is de-asserted to turn off the transfer transistor 234. After the charge transfer process is complete, a shutter gate control signal SHT may be asserted to turn on a shutter transistor 235. When the gate of the shutter transistor 235 is turned on, charge in the photodetector 224 is drained to the positive power supply terminal 227 to stop further charge acquisition. The signal associated with the stored charge on the charge storage node 232 is buffered by a source-follower transistor 236. A row select transistor 238 connects the source-follower transistor 236 to a column line 222.

When it is desired to read out the value of the stored charge, a control signal RS is asserted. The read-out value may be, for example, the value of the stored charge that is represented by the signal at the source terminal S of the source-follower transistor 236. When the control signal RS is asserted, the row select transistor 238 turns on and a signal Vout that is representative of the magnitude of the charge on the charge storage node 232 is produced on an output path 240. Also, when the control signal RS is asserted, the column line 222 can be used to route the signal Vout from the image sensor pixel 212 to readout circuitry, such as the column controller 218 in FIG. 2A.

Figure 3A:
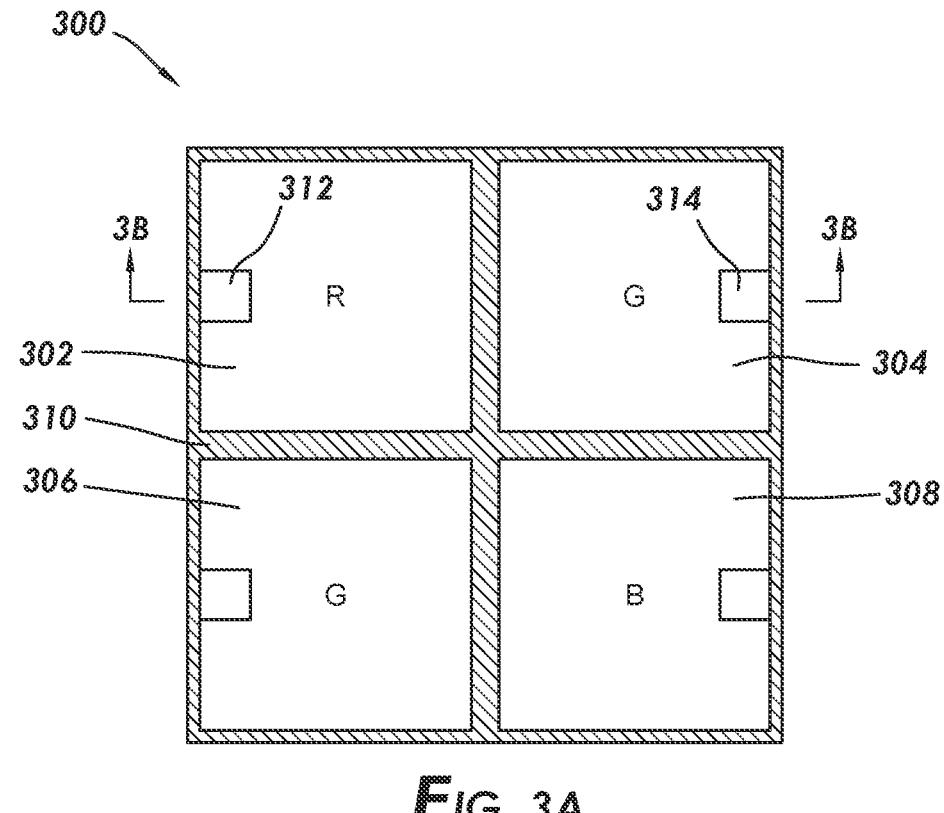
FIG. 3A is an back-side view of an example of a color pattern of back-side illumination (BSI) pixels with charge storage nodes positioned at the edges of the BSI pixels in accordance with some implementations.

FIG. 3A shows a back-side view of an example of a color pattern 300 of BSI pixels. In particular, the color pattern 300 includes a red pixel 302, a first green pixel 304, a second green pixel 306, and a blue pixel 308. Each of the four BSI pixels are separated by a deep trench isolation (DTI) 310. Further, each of the four BSI pixels includes a charge storage node positioned at the edge of the BSI pixel. For example, the red pixel 302 shown in FIG. 3A includes a charge storage node 312 positioned at the edge of the red pixel 302. Further, the first green pixel 304 shown in FIG. 3A includes a charge storage node 314 positioned at the edge of the first green pixel 304.

Figure 3B:
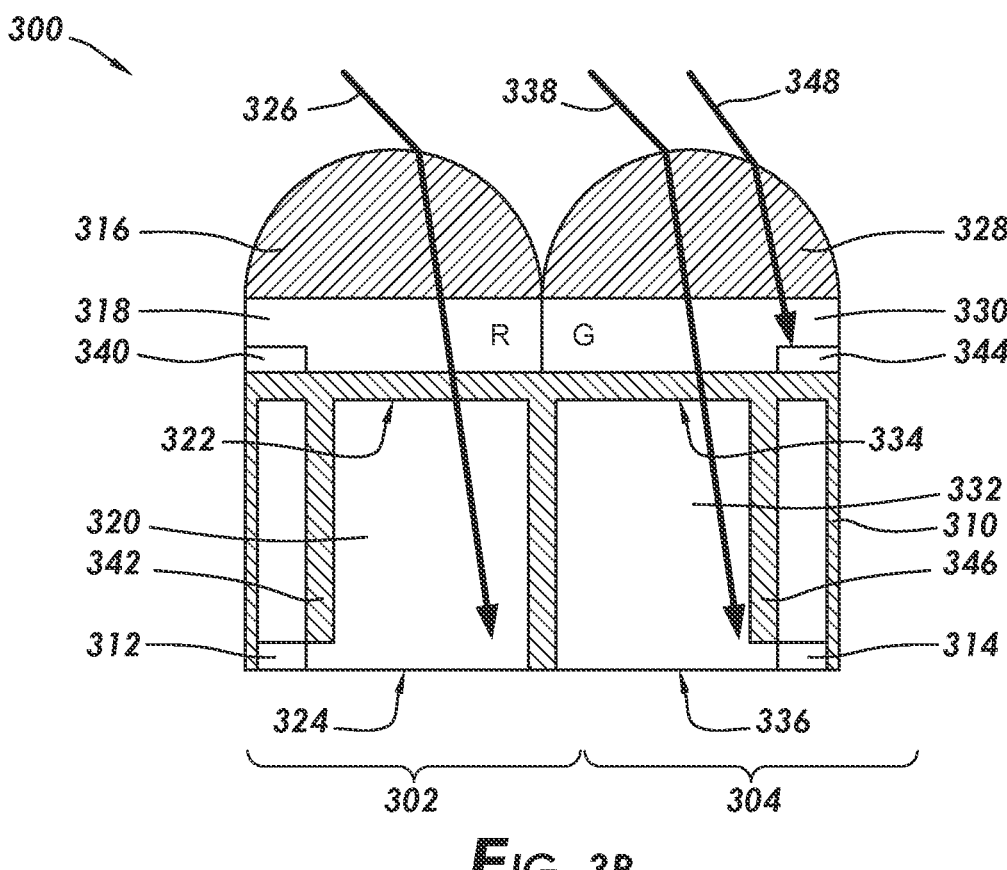
FIG. 3B is a cross-sectional view of the color pattern of FIG. 3A in accordance with some implementations in accordance with some implementations.

FIG. 3B shows a cross-sectional view of the color pattern 300 taken at line 3B-3B of FIG. 3A. In particular, FIG. 3B shows that the red pixel 302 is partially made up of the charge storage node 312, a microlens 316, a red organic color filter 318, and a photosensitive region 320. The microlens 316 and the red organic color filter 318 are positioned on a front-side 322 of the photosensitive region 320. The charge storage node 312 is positioned on a back-side 324 of the photosensitive region 320. Consider, for purposes of discussion, red light entering the red pixel 302. An example of such red light is illustrated in FIG. 3B by arrow 326. The red light initially encounters the microlens 316, which may be a convex lens designed and constructed to direct the incoming light into the lower regions of the red pixel 302.

The red light then encounters the red organic color filter 318. The material of the red organic color filter 318 is selected to pass light having wavelengths corresponding to red, such as between about 595 and 655 nanometers (nm), and to filter (or absorb) light of other colors. The red light then passes into the photosensitive region 320 where the red light is absorbed. The absorption of the red light produces a corresponding electrical signal having a parameter indicative of the intensity of the red light received, such as the number of photons received during the detection period. The parameter indicative of the intensity may be any suitable parameter, such as amplitude of the current or magnitude amplitude of the voltage. Thus, the red pixel 302 produces an electrical signal proportional the amount of the red light that finds its way into the photosensitive region 320.

Similarly, FIG. 3B shows that the first green pixel 304 is partially made up of the charge storage node 314, a microlens 328, a green organic color filter 330, and a photosensitive region 332. The microlens 328 and the green organic color filter 330 are positioned on a front-side 334 of the photosensitive region 332. The charge storage node 314 is positioned on a back-side 336 of the photosensitive region 332. Consider, for purposes of discussion, green light entering the first green pixel 304. An example of such green light is illustrated in FIG. 3B by arrow 338. The green light received at the first green pixel 304 initially encounters the microlens 328. The green light then encounters the green organic color filter 330. The material of the green organic color filter 330 is selected to pass light having wavelengths corresponding to green, such as between about 515 and 575 nm, and to filter (or absorb) light of other colors. The green light then passes into the photosensitive region 332 where the green light is absorbed. The absorption of the green light produces a corresponding electrical signal having a parameter indicative of the intensity of the green light received. Again, the parameter indicative of the intensity may be any suitable parameter, such as amplitude of the current or magnitude amplitude of the voltage. Thus, the first green pixel 304 produces an electrical signal proportional the amount of green light that finds its way into the photosensitive region 332. A similar discussion regarding the second green pixel 306 and the blue pixel 308, each of which may be configured in a same or similar manner, is omitted so as not to unduly lengthen the specification.

Global shutter imaging systems perform global exposure of all pixels at the same time. However, the readout of the pixels is sequential. Thus, the charge storage node in a pixel may collect unwanted charge before the row of the pixel is read. In an array of pixels, the pixels in the rows that are read last may be most negatively impacted from unwanted charge, such as parasitic light. The red pixel 302 shown in FIG. 3B includes a shielding structure 340 and a DTI 342 to protect the charge storage node 312 from unwanted charge. Similarly, the first green pixel 304 shown in FIG. 3B includes a shielding structure 344 and a DTI 346 to protect the charge storage node 314 from unwanted charge. The shielding structure 344 is positioned above the charge storage node 314 to block direct incoming light. In particular, the shielding structure 344 shown in FIG. 3B is positioned above the front-side 334 of the photosensitive region 332. The shielding structure 344 may comprise one or more metals including, for example, Tungsten, Titanium, Titanium Nitride, or a combination thereof. Consider, for purposes of discussion, green light entering the first green pixel 304. An example of such green light is illustrated in FIG. 3B by arrow 348. The green light received at the first green pixel 304 initially encounters the microlens 328. The green light then encounters the green organic color filter 330, which passes the green light to the shielding structure 344. The shielding structure 344 blocks the green light from entering into the photosensitive region 332 and being potentially collected by the charge storage node 314. While the shielding structure 344 prevents the charge storage node 314 from collecting unwanted charge, the shielding structure 344 also prevents light from being collected, for example, by the photosensitive region 332. Thus, the shielding structure 344 lowers the overall light collection capability of the first green pixel 304.

In some implementations, the DTIs 310, 342, and 346 include tungsten. The DTI 346 extends from the front-side 334 of the photosensitive region 332 toward the charge storage node 314. The DTI 346 blocks the charge storage node 314 from collecting incoming, reflected, and scattered light from the back-side 336 of the photosensitive region 332. However, the DTI 346 does not touch the back-side 336 of the photosensitive region 332 so that charge absorbed in the photosensitive region 332 can be transferred and stored in the charge storage node 314. Thus, unwanted charge can still leak into the charge storage node 314. For example, referring again to arrow 338 illustrated in FIG. 3B, the green light may reflect off of the back-side 336 of the photosensitive region 332 and enter the charge storage node 314 via the opening between the DTI 346 and the back-side 336 of the photosensitive region 332.

Overall light collection capability and prevention of charge storage nodes from collecting unwanted charge may both be improved by use of nanophotonic light guides or spectral routers. In particular, a spectral router is a semiconductor structure that accepts photons incident on an upper surface. The spectral router then diverts photons from the upper surface to the underlying photosensitive regions. As will be described below, spectral routers focus light away from shielding structures and into photosensitive regions of pixels. Further, spectral routers keep unwanted light away from charge storage nodes.

Figure 4A:
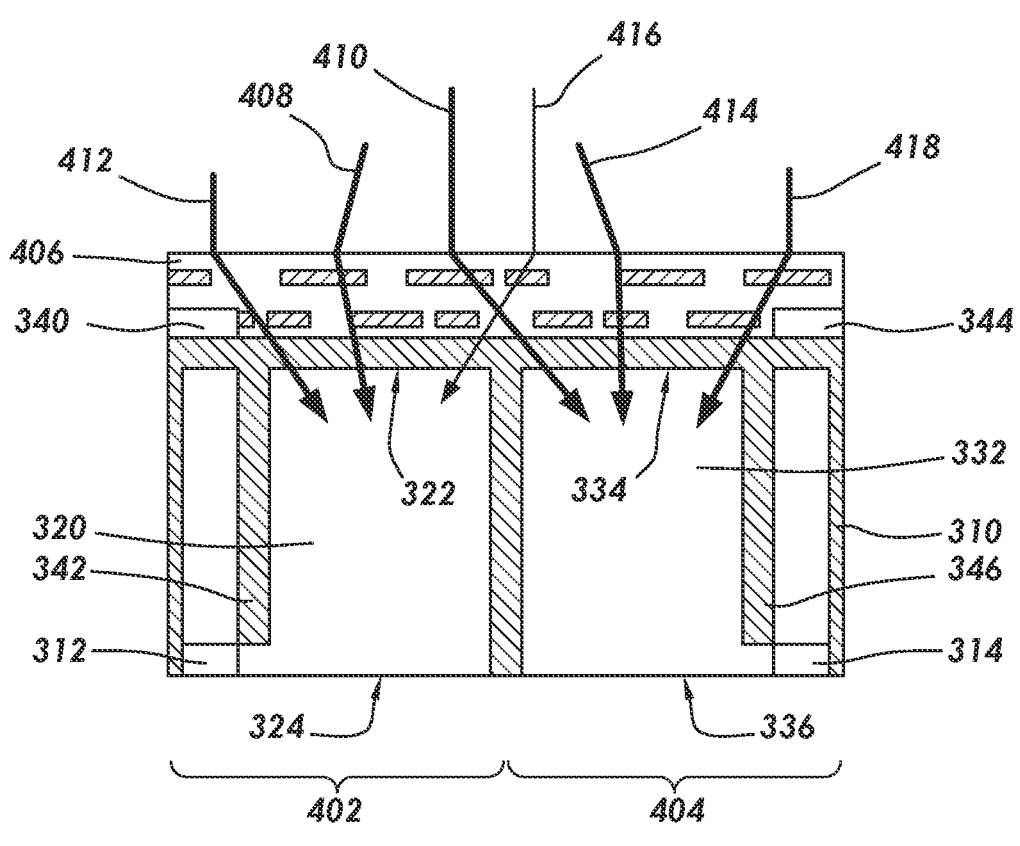
FIG. 4A is a cross-sectional view of an example of BSI pixels with a spectral router and non-recessed shielding structures in accordance with some implementations.

FIG. 4A shows a cross-sectional view of an example of a red pixel 402 and a green pixel 404 in a color pattern of BSI pixels. The red pixel 402 shown in FIG. 4A is partially made up of the charge storage node 312, the photosensitive region 320, the shielding structure 340, and the DTI 342 described above in relation to FIGS. 3A and 3B. Similarly, the green pixel 404 shown in FIG. 4A is partially made up of the charge storage node 314, the photosensitive region 332, the shielding structure 344, and the DTI 346 described above in relation to FIGS. 3A and 3B. However, in FIG. 4A, a spectral router 406 is included instead of the microlenses 316 and 328, the red organic color filter, 318, and the green organic color filter 330. The spectral router 406 shown in FIG. 4A is positioned on the front-sides 322 and 334 of the photosensitive regions 320 and 332.

The portion of the spectral router 406 positioned above the red pixel 402 is configured to pass light having wavelengths corresponding to red into the photosensitive region 320 of the red pixel 402 and away from the charge storage node 312. Consider, for purposes of discussion, red light entering the red pixel 402. An example of such red light is illustrated in FIG. 4A by arrow 408. The red light initially encounters the spectral router 406, which directs the red light into the photosensitive region 320 of the red pixel 402 and away from the charge storage node 312. The portion of the spectral router 406 positioned above the red pixel 402 is also configured to direct non-red light to neighboring pixels. Consider, for purposes of discussion, green light entering the red pixel 402. An example of such green light is illustrated in FIG. 4A by arrow 410. The green light initially encounters the spectral router 406, which directs the green light to the photosensitive region 332 of the green pixel 404. The portion of the spectral router 406 positioned above the red pixel 402 is further configured to direct light away from the shielding structure 340. Consider, for purposes of discussion, red light entering the red pixel 402 above the shielding structure 340. An example of such red light is illustrated in FIG. 4A by arrow 412. The red light initially encounters the spectral router 406, which directs the red light away from the shielding structure 340 and into the photosensitive region 320 of the red pixel 402.

The portion of the spectral router 406 positioned above the green pixel 404 is configured to pass light having wavelengths corresponding to green into the photosensitive region 332 of the green pixel 404 and away from the charge storage node 314. Consider, for purposes of discussion, green light entering the green pixel 404. An example of such green light is illustrated in FIG. 4A by arrow 414. The green light initially encounters the spectral router 406, which directs the green light into the photosensitive region 332 of the green pixel 404 and away from the charge storage node 314. The portion of the spectral router 406 positioned above the green pixel 404 is also configured to direct non-green light to neighboring pixels. Consider, for purposes of discussion, red light entering the green pixel 404. An example of such red light is illustrated in FIG. 4A by arrow 416. The red light initially encounters the spectral router 406, which directs the red light to the photosensitive region 320 of the red pixel 402. The portion of the spectral router 406 positioned above the green pixel 404 is further configured to direct light away from the shielding structure 344. Consider, for purposes of discussion, green light entering the green pixel 404 above the shielding structure 344. An example of such green light is illustrated in FIG. 4A by arrow 418. The green light initially encounters the spectral router 406, which directs the green light away from the shielding structure 344 and into the photosensitive region 332 of the green pixel 404.

Figure 4B:
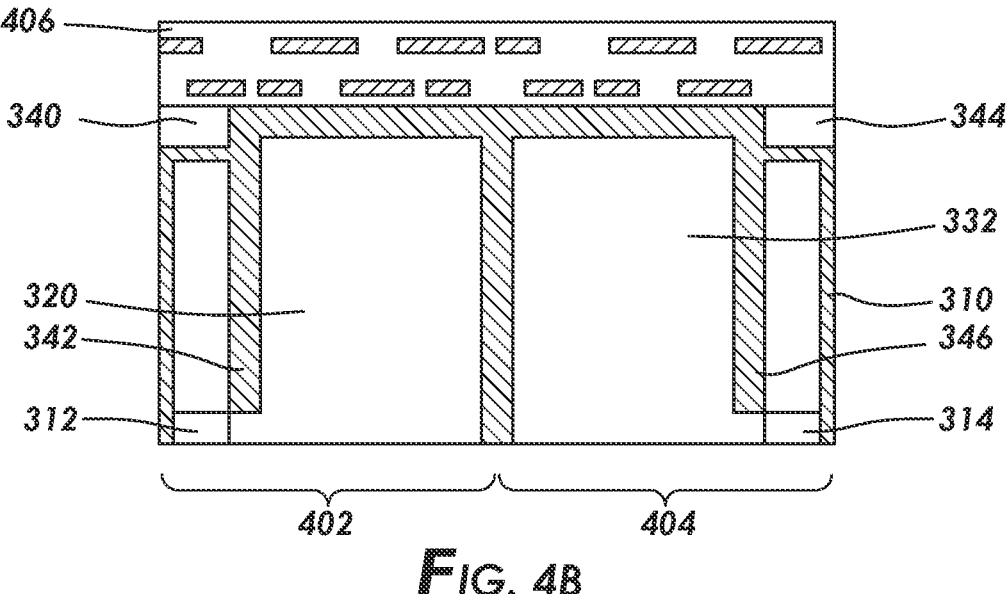
FIG. 4B is a cross-sectional view of an example of BSI pixels with a spectral router and recessed shielding structures in accordance with some implementations.

In some implementations, the shielding structures 340 and 344 are positioned above the front-sides 322 and 334 of the photosensitive regions 320 and 332 as illustrated in FIG. 4A. In alternate implementations, the shielding structures 340 and 344 may be recessed within photosensitive regions 320 and 332, respectively. For example, the shielding structure 340 shown in FIG. 4B is recessed within the photosensitive region 320 of the red pixel 402. Further, the shielding structure 344 shown in FIG. 4B is recessed within the photosensitive region 332 of the green pixel 404. Recessing the shielding structures 340 and 344 within the photosensitive regions 320 and 332 may enable easier manufacturing of the spectral router 406.

Figure 5A:
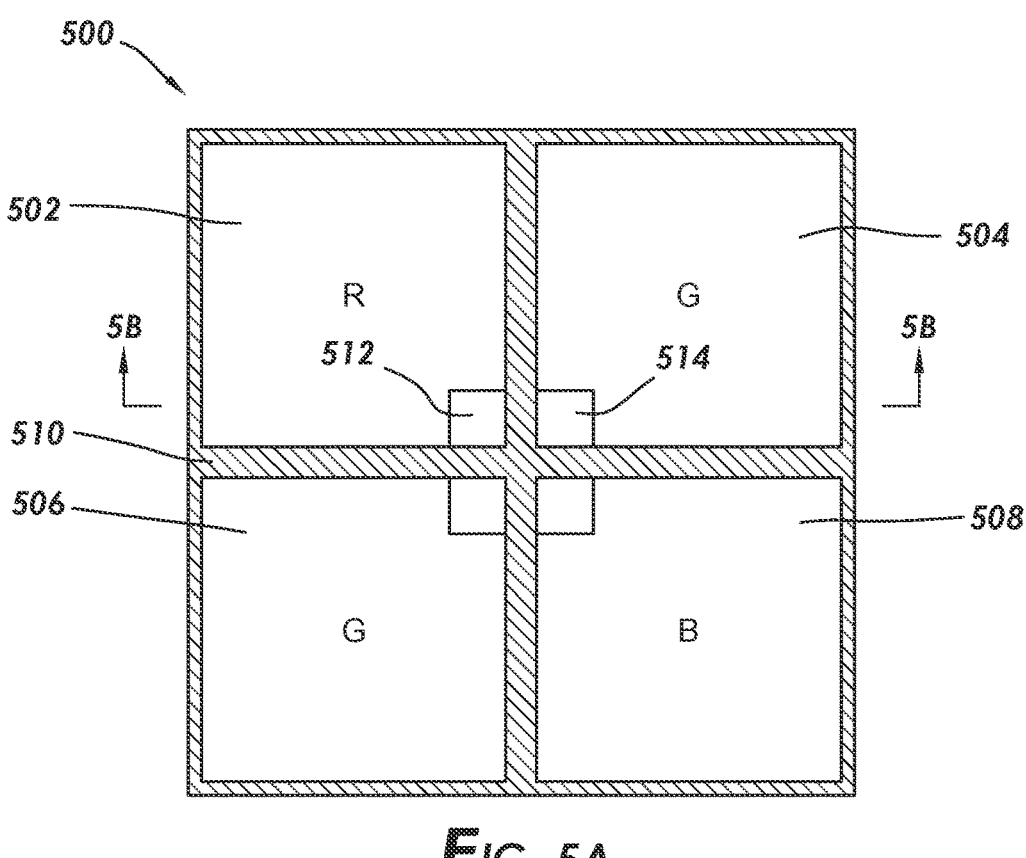
FIG. 5A is an back-side view of an example of a color pattern of BSI pixels with charge storage nodes positioned at inside corners of the BSI pixels in accordance with some implementations.

In some implementations, charge storage nodes are positioned at the edges of BSI pixels in a color pattern as illustrated in FIG. 3A. In alternate implementations, charge storage nodes may be positioned at the corners of BSI pixels in a color pattern. For example, FIG. 5A shows a back-side view of an example of a color pattern 500 of a red pixel 502, a first green pixel 504, a second green pixel 506, and a blue pixel 508. Each of the four BSI pixels are separated by a DTI 510. Further, each of the four BSI pixels includes a charge storage node positioned at the inside corner of the BSI pixel. For example, the red pixel 502 shown in FIG. 5A includes a charge storage node 512 positioned at the inside corner of the red pixel 502. Further, the first green pixel 504 shown in FIG. 5A includes a charge storage node 514 positioned at the inside corner of the first green pixel 504.

Figure 5B:
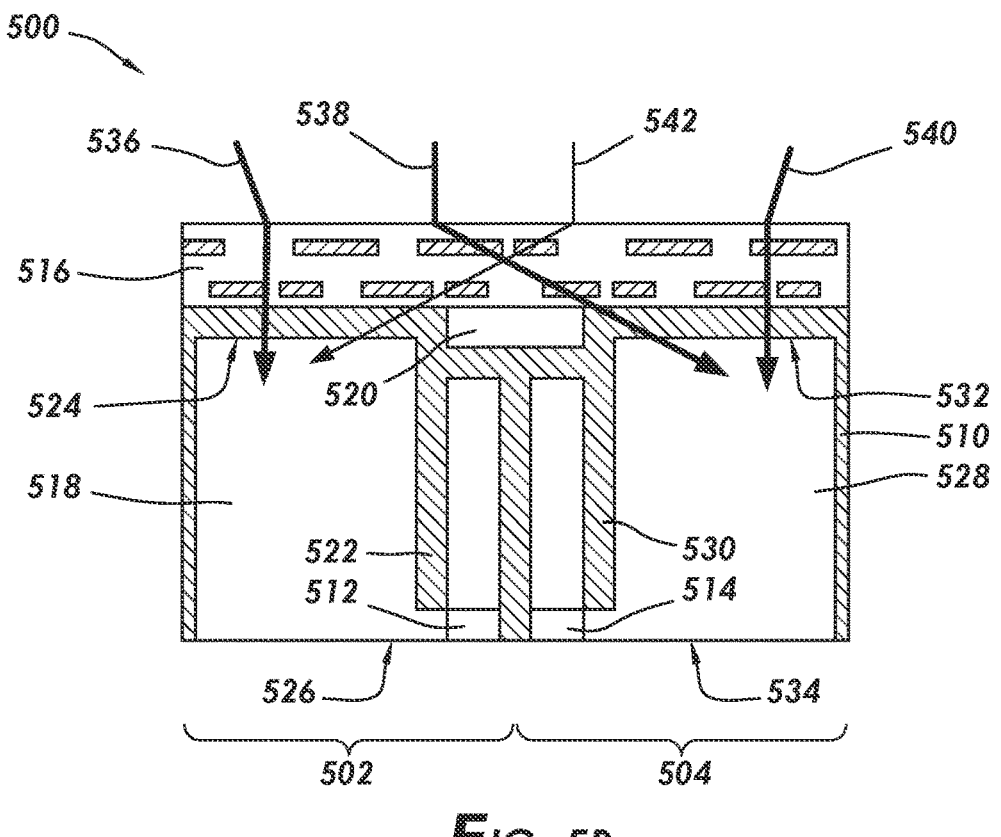
FIG. 5B is a cross-sectional view of the color pattern of FIG. 5A in accordance with some implementations in accordance with some implementations.

FIG. 5B shows a cross-sectional view of the color pattern 500 taken at line 5B-5B of FIG. 5A. In particular, FIG. 5B shows that the red pixel 502 is made up of the charge storage node 512, a spectral router 516, a photosensitive region 518, a shielding structure 520, and a DTI 522. The spectral router 516 is positioned on a front-side 524 of the photosensitive region 518. The charge storage node 512 is positioned on a back-side 526 of the photosensitive region 518. The shielding structure 520 is recessed within the photosensitive region 518 on the front-side 524 of the photosensitive region 518. The DTI 522 extends from the front-side 524 of the photosensitive region 518 toward the charge storage node 512, but does not touch the back-side 526 of the photosensitive region 518.

Similarly, the first green pixel 504 shown in FIG. 5B is made up of the charge storage node 514, the spectral router 516, the shielding structure 520, a photosensitive region 528, and a DTI 530. The spectral router 516 is positioned on a front-side 532 of the photosensitive region 528. The charge storage node 514 is positioned on a back-side 534 of the photosensitive region 528. The shielding structure 520 is recessed within the photosensitive region 528 on the front-side 532 of the photosensitive region 528. The DTI 530 extends from the front-side 532 of the photosensitive region 528 toward the charge storage node 514, but does not touch the back-side 534 of the photosensitive region 528. In some implementations, the DTIs 510, 522, and 530 include tungsten.

The portion of the spectral router 516 positioned above the red pixel 502 is configured to pass light having wavelengths corresponding to red into the photosensitive region 518 of the red pixel 502 and away from the charge storage node 512. Consider, for purposes of discussion, red light entering the red pixel 502. An example of such red light is illustrated in FIG. 5B by arrow 536. The red light initially encounters the spectral router 516, which directs the red light into the photosensitive region 518 of the red pixel 502 and away from the charge storage node 512. The portion of the spectral router 516 positioned above the red pixel 502 is also configured to direct non-red light to neighboring pixels. Consider, for purposes of discussion, green light entering the red pixel 502. An example of such green light is illustrated in FIG. 5B by arrow 538. The green light initially encounters the spectral router 516, which directs the green light to the photosensitive region 528 of the first green pixel 504.

The portion of the spectral router 516 positioned above the first green pixel 504 is configured to pass light having wavelengths corresponding to green into the photosensitive region 528 of the first green pixel 504 and away from the charge storage node 514. Consider, for purposes of discussion, green light entering the first green pixel 504. An example of such green light is illustrated in FIG. 5B by arrow 540. The green light initially encounters the spectral router 516, which directs the green light into the photosensitive region 528 of the first green pixel 504 and away from the charge storage node 514. The portion of the spectral router 516 positioned above the first green pixel 504 is also configured to direct non-green light to neighboring pixels. Consider, for purposes of discussion, red light entering the first green pixel 504. An example of such red light is illustrated in FIG. 5B by arrow 542. The red light initially encounters the spectral router 516, which directs the red light to the photosensitive region 518 of the red pixel 502.

The spectral router 516 is also configured to direct light away from the shielding structure 520. Consider, for purposes of discussion, red light entering the first green pixel 504 above the shielding structure 520. An example of such red light is illustrated in FIG. 5B by arrow 542. The red light initially encounters the spectral router 516, which directs the red light away from the shielding structure 520 and into the photosensitive region 518 of the red pixel 502.

Figures 6A, 6B:
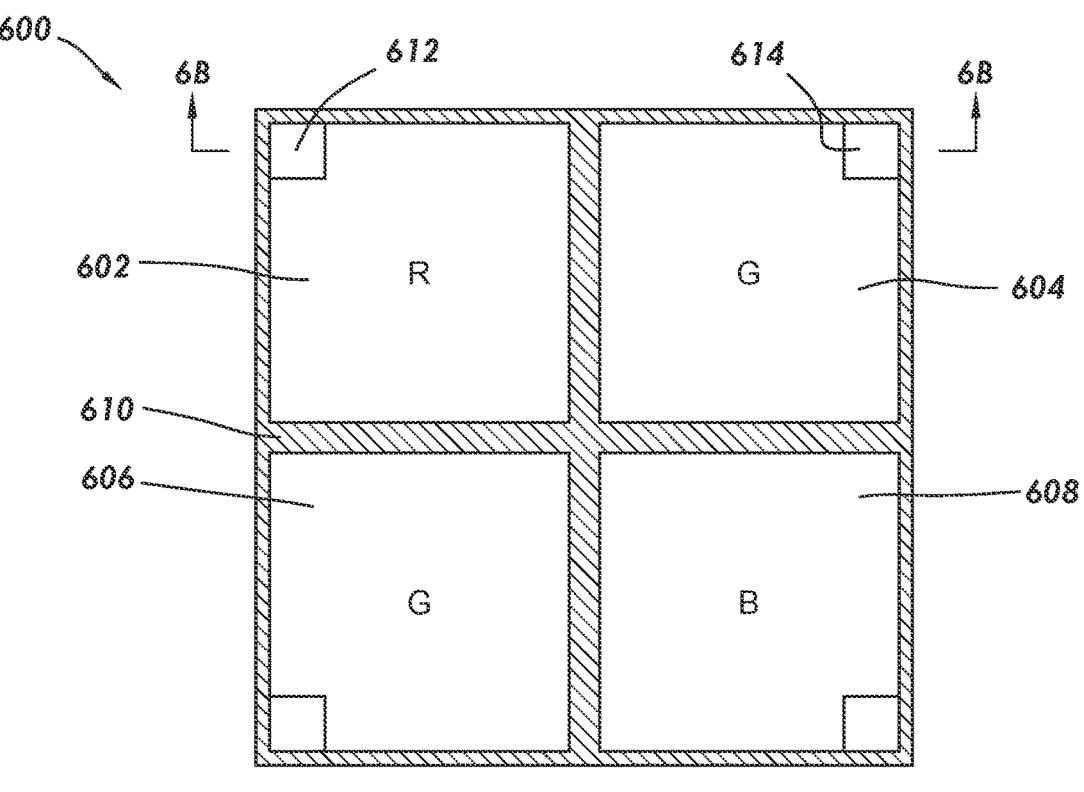
FIG. 6A is an back-side view of an example of a color pattern of BSI pixels with charge storage nodes positioned at outside corners of the BSI pixels in accordance with some implementations.
FIG. 6B is a cross-sectional view of the color pattern of FIG. 6A in accordance with some implementations in accordance with some implementations.

In some implementations, each pixel may include two stacked spectral routers. For example, FIG. 6A shows a back-side view of an example of a color pattern 600 of a red pixel 602, a first green pixel 604, a second green pixel 606, and a blue pixel 608. Each of the four BSI pixels are separated by a DTI 610. Further, each of the four BSI pixels includes a charge storage node positioned at the outside corner of the BSI pixel. For example, the red pixel 602 shown in FIG. 6A includes a charge storage node 612 positioned at the outside corner of the red pixel 602. Further, the first green pixel 604 shown in FIG. 6A includes a charge storage node 614 positioned at the outside corner of the first green pixel 604.

FIG. 6B shows a cross-sectional view of the color pattern 600 taken at line 6B-6B of FIG. 6A. In particular, FIG. 6B shows that the red pixel 602 is made up of the charge storage node 612, spectral routers 616 and 618, a photosensitive region 620, a shielding structure 622, and a DTI 624. The spectral router 616 is positioned on a front-side 626 of the photosensitive region 620. The spectral router 618 is positioned above the spectral router 616. The charge storage node 612 is positioned on a back-side 628 of the photosensitive region 620. The shielding structure 622 is recessed within the photosensitive region 620 on the front-side 626 of the photosensitive region 620. The DTI 624 extends from the front-side 626 of the photosensitive region 620 toward the charge storage node 612, but does not touch the back-side 628 of the photosensitive region 620.

Similarly, the first green pixel 604 shown in FIG. 6B is made up of the charge storage node 614, spectral routers 618 and 630, a photosensitive region 632, a shielding structure 634, and a DTI 636. The spectral router 630 is positioned on a front-side 638 of the photosensitive region 632. The spectral router 618 is positioned above the spectral router 630. The charge storage node 614 is positioned on a back-side 640 of the photosensitive region 632. The shielding structure 634 is recessed within the photosensitive region 632 on the front-side 638 of the photosensitive region 632. The DTI 636 extends from the front-side 638 of the photosensitive region 632 toward the charge storage node 614, but does not touch the back-side 640 of the photosensitive region 632. In some implementations, the DTIs 610, 624, and 636 include Tungsten.

The spectral router 616 is configured to divert light away from the charge storage node 612 and the shielding structure 622 in the red pixel 602. The spectral router 616 is one example of a "first spectral router." The spectral router 618 is configured to split incident light into red, green, and blue light. The spectral router 618 is also configured rout red, green, and blue light to corresponding red, green, and blue pixels. The spectral router 618 is one example of a "second spectral router." The spectral router 630 is configured to divert light away from the charge storage node 614 and the shielding structure 634 in the first green pixel 604. The spectral router 630 is another example of a "first spectral router."

The portion of the spectral router 618 positioned above the spectral router 616 of the red pixel 602 is configured to direct non-red light to neighboring pixels. Consider, for purposes of discussion, green light entering the red pixel 602. An example of such green light is illustrated in FIG. 6B by arrow 642. The green light initially encounters the spectral router 618, which directs the green light to the spectral router 630 of the first green pixel 604. The spectral router 630 directs the green light into the photosensitive region 632 of the first green pixel 604 and away from the charge storage node 614. The portion of the spectral router 618 positioned above the spectral router 616 is also configured to pass light having wavelengths corresponding to red. Consider, for purposes of discussion, red light entering the red pixel 602. An example of such red light is illustrated in FIG. 6B by arrow 644. The red light initially encounters the spectral router 618, which passes the red light to the spectral router 616 of the red pixel 602. The spectral router 616 directs the red light into the photosensitive region 620 of the red pixel 602 and away from the charge storage node 612. The portion of the spectral router 616 positioned above the shielding structure 622 is configured to divert light away from the shielding structure 622. Consider, for purposes of discussion, red light entering the red pixel 602 above the shielding structure 622. An example of such red light is illustrated in FIG. 6B by arrow 646. The red light initially encounters the spectral router 618, which passes the red light to the spectral router 616 of the red pixel 602. The spectral router 616 directs the red light away from the shielding structure 622 and into the photosensitive region 620 of the red pixel 602.

The portion of the spectral router 618 positioned above the spectral router 630 of the first green pixel 604 is configured to direct non-green light to neighboring pixels. Consider, for purposes of discussion, red light entering the first green pixel 604. An example of such red light is illustrated in FIG. 6B by arrow 648. The red light initially encounters the spectral router 618, which directs the red light to the spectral router 616 of the red pixel 602. The spectral router 616 directs the red light into the photosensitive region 620 of the red pixel 602 and away from the charge storage node 612. The portion of the spectral router 618 positioned above the spectral router 630 of the first green pixel 604 is also configured to pass light having wavelengths corresponding to green. Consider, for purposes of discussion, green light entering the first green pixel 604. An example of such green light is illustrated in FIG. 6B by arrow 650. The green light initially encounters the spectral router 618, which passes the green light to the spectral router 630 of the first green pixel 604. The spectral router 630 directs the green light into the photosensitive region 632 of the first green pixel 604 and away from the charge storage node 614. The portion of the spectral router 630 positioned above the shielding structure 634 is configured to divert light away from the shielding structure 634. Consider, for purposes of discussion, green light entering the first green pixel 604 above the shielding structure 634. An example of such green light is illustrated in FIG. 6B by arrow 652. The green light initially encounters the spectral router 618, which passes the green light to the spectral router 630 of the first green pixel 604. The spectral router 630 directs the green light away from the shielding structure 634 and into the photosensitive region 632 of the first green pixel 604.

Figure 7:
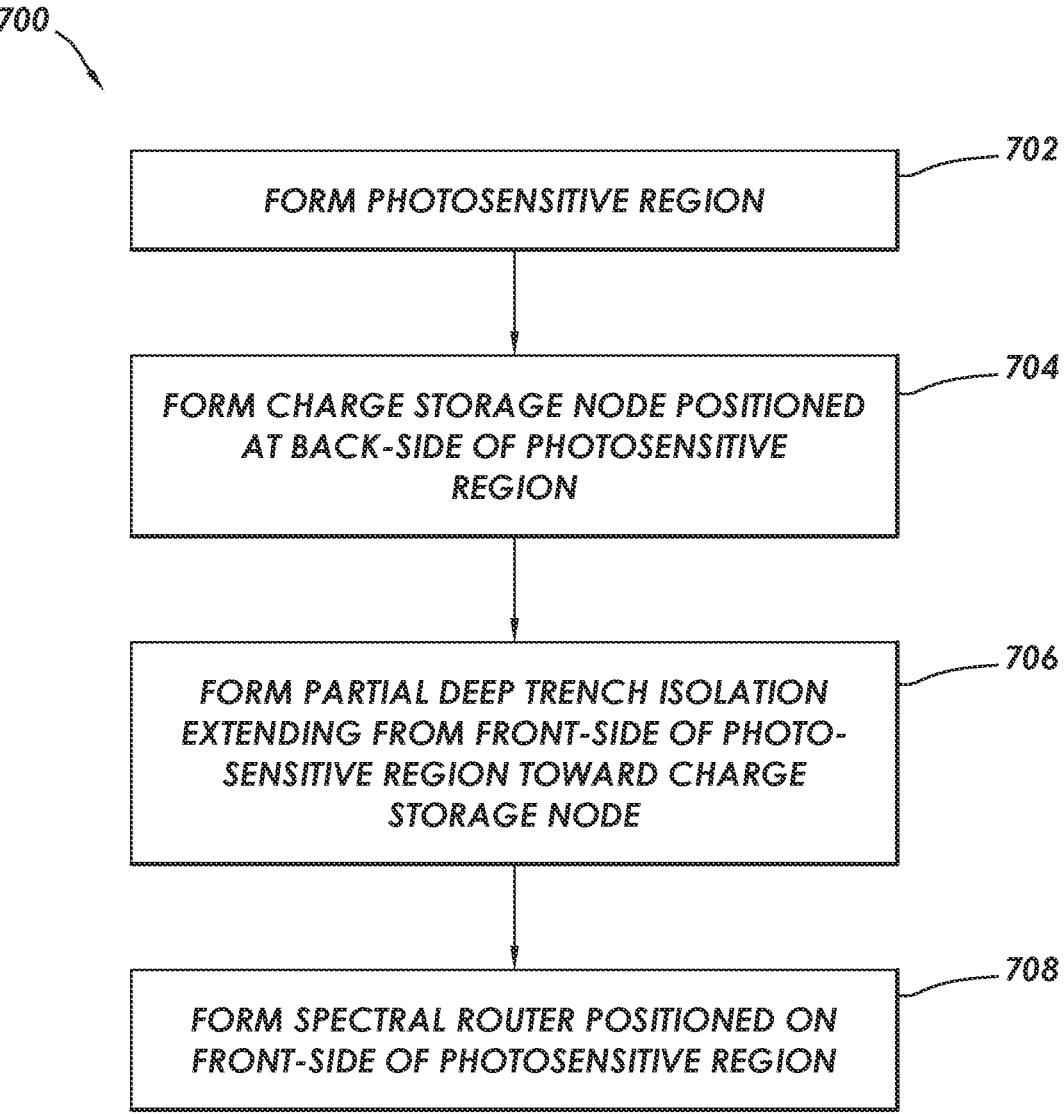
FIG. 7 is a flow diagram of an example of a method for constructing an image sensor pixel in accordance with some implementations.

FIG. 7 is a flow diagram of an example of a method 700 for constructing an image sensor pixel in accordance with some implementations. For simplicity of explanation, the method 700 is depicted in FIG. 7 and described as a series of operation. However, the operations can occur in various orders and/or concurrently, and/or with other operations not presented and described herein. At block 702, the photosensitive region is formed. At block 704, a charge storage node is formed. The charge storage node is positioned at a back-side of the photosensitive region. At block 706, a partial deep trench isolation is formed. The partial deep trench isolation extends from a front-side of the photosensitive region toward the charge storage node. For example, the partial deep trench isolation may be DTI 342, DTI 346, DTI 522, DTI 530, DTI 624, or DTI 636. In some implementations, a full deep trench isolation is also formed. The full deep trench isolation extends from the front-side to the back-side of the photosensitive region. At block 708, a spectral router is formed. The spectral router is positioned on the front-side of the photosensitive region.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various implementations of the present invention. Numerous variations and modifications will become apparent to those skilled in the art once the above disclosure is fully appreciated. It is intended that the following claims be interpreted to embrace all such variations and modifications.

What is claimed is:

1. An image sensor pixel, comprising:
a photosensitive region;
a charge storage node positioned on a back-side of the photosensitive region;
a deep trench isolation extending from a front-side of the photosensitive region toward the charge storage node; and
a spectral router positioned on the front-side of the photosensitive region, wherein the spectral router is configured to:
route photons of a first wavelength received at the spectral router into the photosensitive region and away from the charge storage node, and
route photons of a second wavelength received at the spectral router to one or more neighboring image sensor pixels.

2. The image sensor pixel of claim 1, further comprising a shielding structure positioned proximate to the front-side of the photosensitive region and above the charge storage node, wherein the spectral router is further configured to route the photons of the first wavelength received at the spectral router away from the shielding structure.

3. The image sensor pixel of claim 2, wherein the shielding structure is recessed in the photosensitive region.

4. The image sensor pixel of claim 1, wherein the deep trench isolation comprises tungsten.

5. The image sensor pixel of claim 1, wherein the charge storage node is further positioned at a corner of the back-side of the photosensitive region.

6. The image sensor pixel of claim 1, wherein the charge storage node is further positioned at an edge of the back-side of the photosensitive region.

7. An imaging system comprising:
a lens system;
an imaging controller; and
an image sensor in operational relationship with the lens system and electrically coupled to the imaging controller, wherein the image sensor including an array of pixels, wherein the array of pixels includes the imaging sensor pixel of claim 1.

8. The imaging system of claim 7, wherein the imaging system is at least one selected from the group consisting of an automobile, a vehicle, a camera, a cellular telephone, a tablet computing, a webcam, a video camera, a video surveillance system, and a video gaming system.

9. A method for constructing an image sensor pixel, the method comprising:
forming a photosensitive region;
forming a charge storage node positioned at a back-side of the photosensitive region;
forming a partial deep trench isolation extending from a front-side of the photosensitive region toward the charge storage node; and
forming a spectral router positioned on the front-side of the photosensitive region,
wherein the spectral router is configured to:
route photons of a first wavelength received at the spectral router into the photosensitive region and away from the charge storage node, and
route photons of a second wavelength received at the spectral router to one or more neighboring image sensor pixels.

10. The method of claim 9, further comprising forming a shielding structure positioned proximate the front-side of the photosensitive region and above the charge storage node, wherein the spectral router is further configured to route the photons of the first wavelength received at the spectral router away from the shielding structure.

11. The method of claim 10, wherein forming the shielding structure further includes recessing the shielding structure in the photosensitive region.

12. The method of claim 9, wherein forming the charge storage node further includes positioning the charge storage node at a corner of the back-side of the photosensitive region.

13. The method of claim 12, wherein forming the charge storage node further includes positioning the charge storage node at an edge of the back-side of the photosensitive region.

* * * * *